(12) United States Patent
Xu et al.

(10) Patent No.: US 9,086,982 B1
(45) Date of Patent: Jul. 21, 2015

(54) ADJUSTING BIT RELIABILITY INFORMATION INPUT FOR DECODING STORED DATA

(71) Applicant: Marvell International Ltd., Hamilton (BM)

(72) Inventors: Wei Xu, Milpitas, CA (US); Bo Fu, Santa Clara, CA (US); Jinjin He, San Jose, CA (US); Fei Sun, Irvine, CA (US); Siu-Hung Frederick Au, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 84 days.

(21) Appl. No.: 13/956,051

(22) Filed: Jul. 31, 2013

Related U.S. Application Data

(60) Provisional application No. 61/683,374, filed on Aug. 15, 2012.

(51) Int. Cl.
*G11C 29/00* (2006.01)
*G06F 11/10* (2006.01)
*G06F 11/07* (2006.01)

(52) U.S. Cl.
CPC ............ *G06F 11/10* (2013.01); *G06F 11/0751* (2013.01)

(58) Field of Classification Search
CPC . G06F 11/10; G06F 11/1012; G06F 11/1048; G06F 12/00; H03M 13/05; H03M 13/09; H03M 13/1102; H03M 13/152; H03M 13/19; H03M 13/1515; G11C 11/16; G11C 16/28; G11C 29/02; G11C 29/42; G11C 29/026
See application file for complete search history.

(56) References Cited

U.S. PATENT DOCUMENTS

| | | | |
|---|---|---|---|
| 5,745,482 A * | 4/1998 | Nishiura et al. | 370/327 |
| 8,255,763 B1 | 8/2012 | Yang | |
| 8,307,268 B2 | 11/2012 | Chaichanavong | |
| 8,438,461 B2 | 5/2013 | Varnica | |
| 8,504,887 B1 | 8/2013 | Varnica | |
| 8,661,325 B2 | 2/2014 | Chaichanavong | |
| 8,694,868 B1 | 4/2014 | Chilappagari | |
| 8,839,073 B2 * | 9/2014 | Cohen | 714/763 |
| 8,862,970 B1 | 10/2014 | Varnica | |
| 8,910,028 B1 | 12/2014 | Li | |
| 8,929,472 B1 | 1/2015 | Lee | |
| 2010/0177564 A1 * | 7/2010 | Feeley et al. | 365/185.09 |
| 2011/0182119 A1 * | 7/2011 | Strasser et al. | 365/185.03 |
| 2013/0297986 A1 * | 11/2013 | Cohen | 714/763 |
| 2013/0297988 A1 * | 11/2013 | Wu et al. | 714/773 |
| 2014/0040704 A1 * | 2/2014 | WU et al. | 714/773 |

* cited by examiner

*Primary Examiner* — Guerrier Merant

(57) ABSTRACT

The present disclosure includes systems and techniques relating to adjusting bit reliability information input for decoding data stored in a memory device. In some implementations, an apparatus, systems, or methods can include a memory controller that includes circuitry configured to receive data from a memory device, where the data includes at least first and second states; circuitry configured to compare a number of the first and second states of the received data; and circuitry configured to adjust a bit reliability information input to a decoder based, at least in part, on the comparison.

15 Claims, 6 Drawing Sheets

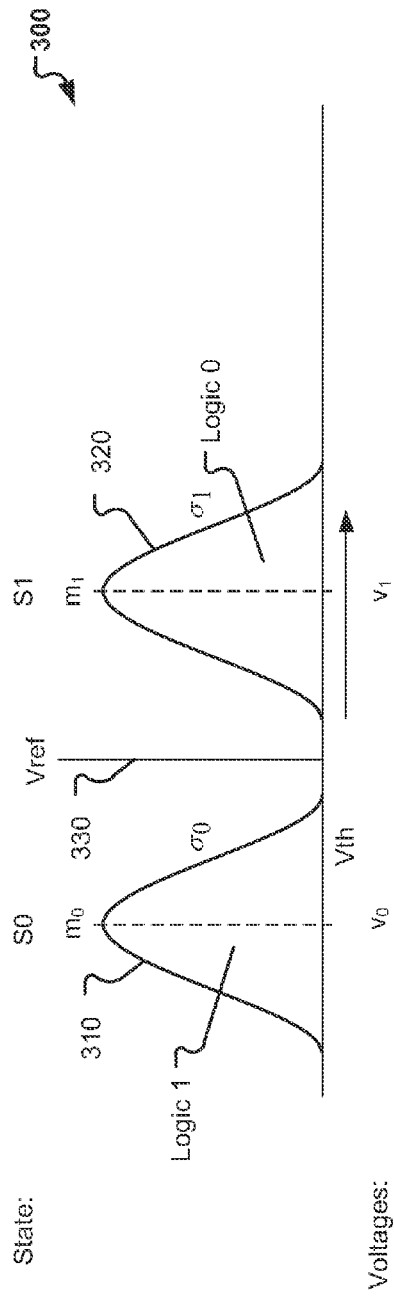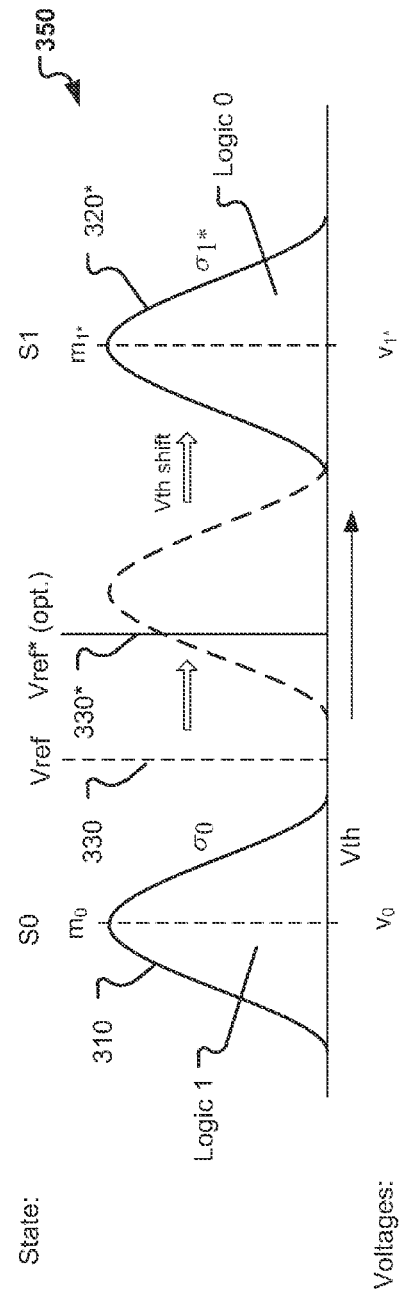
FIG. 3A
FIG. 3B

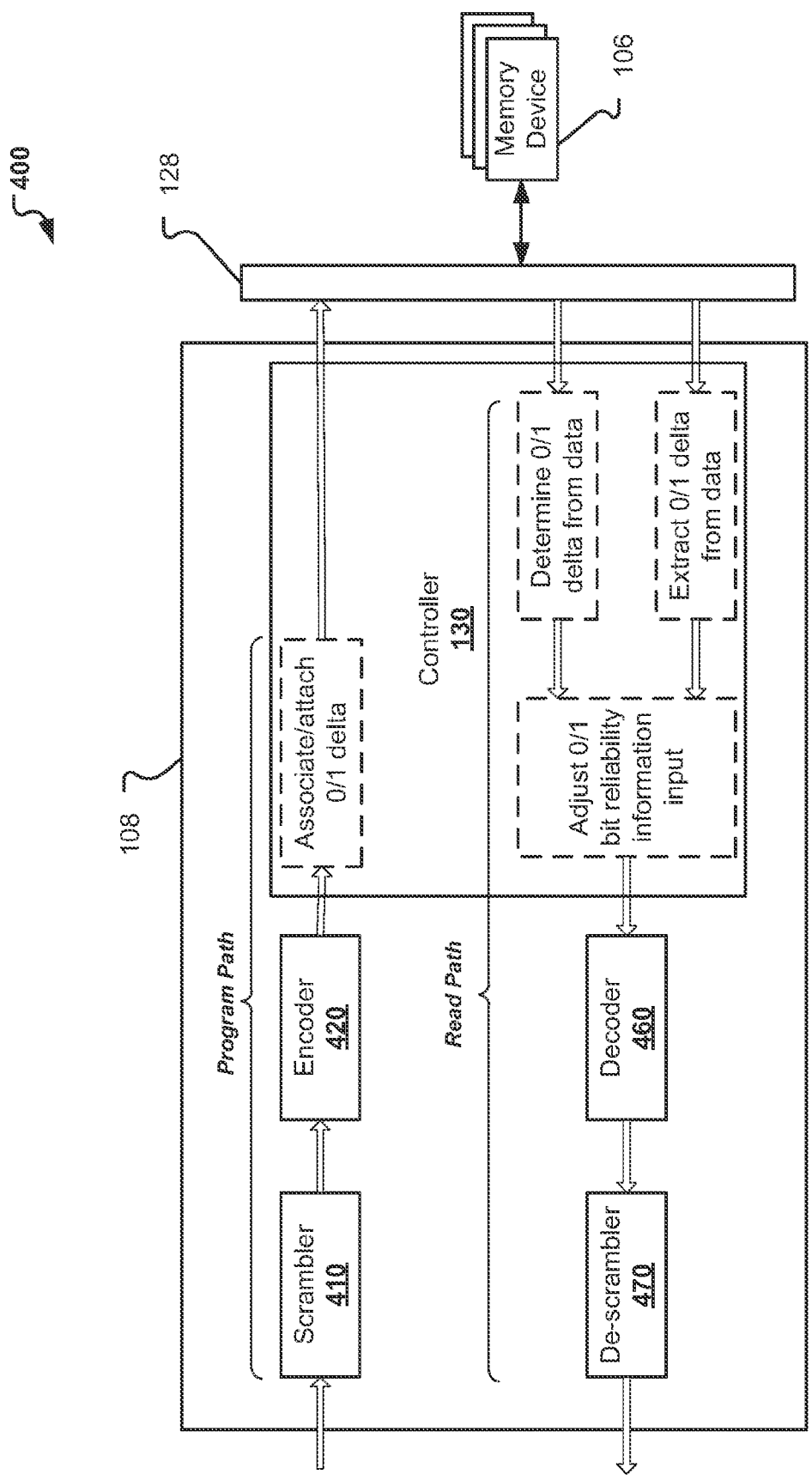

ADJUSTING BIT RELIABILITY INFORMATION INPUT FOR DECODING STORED DATA

CROSS REFERENCE TO RELATED APPLICATIONS

This application claims the benefit of the priority of U.S. Provisional Application Ser. No. 61/683,374, filed Aug. 15, 2012 and entitled "USING 0/1 BIT COUNTS TO ADJUST CHANNEL LLR FOR BETTER LDPC DECODING PERFORMANCE IN NAND FLASH MEMORY," the entire contents of which are hereby incorporated by reference.

BACKGROUND

Devices and systems can store or retrieve data using non-volatile memory structures. For example, a digital camera can store an image to a non-volatile memory structure. In another example, a digital media player such as an MP3 player can read a digital audio file from non-volatile memory and play the contents of the audio file. Mobile devices such as a mobile phone or a personal digital assistant (PDA) can read data from and write data to one or more non-volatile memory structures.

A non-volatile memory structure can include memory cells such as flash memory cells. Various examples of memory cells include a single level cell (SLC) or a multi-level cell (MLC). Memory cells can store data by trapping granulized amounts of charge in, for example, an isolated region of a transistor. This process of trapping charges can be referred to as programming. A controller can estimate an amount of charge stored during readout of the cell. Retrieving data from a memory cell can include applying a read voltage to the transistor and subsequently estimating the readout current which is determined by the amount of charge trapped in the cell.

An example of a type of memory cell is a SLC that can store one bit of information. In such a memory cell, the memory cell can hold or not hold a charge to indicate, for example, logic 1 when a charge is stored, and to indicate logic 0, when no charge is stored.

SUMMARY

The present disclosure includes systems and techniques relating to adjusting bit reliability information input for decoding data stored in a memory device. According to an aspect of the described systems and techniques, a memory controller includes circuitry configured to receive data from a memory device, where the data includes at least first and second states; circuitry configured to compare a number of the first and second states of the received data; and circuitry configured to adjust a bit reliability information input to a decoder based, at least in part, on the comparison.

In some implementations, the comparison provides a first delta, the memory controller further includes circuitry configured to extract a second delta of first and second states, where the second delta has been programmed into the memory device along with the data, and the circuitry configured to adjust includes circuitry configured to compare the first delta and the second delta to adjust the reliability information input.

In some implementations, the memory controller also includes circuitry configured to extract a second delta of first and second states, where the second delta has been programmed into the memory device along with the data; and circuitry configured to attach the second delta to the data during programming of the memory device with the data. In some implementations, the memory controller also includes the decoder that is configured to decode the data based, at least in part, on the adjusted bit reliability information input. The decoder can include a low-density-parity-check (LDPC) decoder.

According to another aspect of the described systems and techniques, a method can include receiving data from a memory device, where the data includes at least first and second states; comparing a number of the first and second states of the received data; and adjusting a bit reliability information input to a decoder based, at least in part, on the comparison.

According to another aspect of the described systems and techniques, a computer-program product, encoded on a computer-readable medium, operable to cause data processing apparatus to perform operations including receiving data from a memory device, where the data includes at least first and second states; comparing a number of the first and second states of the received data; and adjusting a bit reliability information input to a decoder based, at least in part, on the comparison.

Particular embodiments of the subject matter described in this specification can be implemented so as to realize one or more of the following advantages. A real-time optimization of the decoding process can be provided for data retrieved from a memory device by adjusting the bit reliability information input to a decoder, and thus, the re-read probability of the memory device can be reduced.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

Details of one or more implementations are set forth in the accompanying drawings and the description below. Other features, objects, and advantages may be apparent from the description and drawings, and from the claims.

DRAWING DESCRIPTIONS

FIG. 3A shows an example of two states and associated voltage distributions for a single level memory cell.

FIG. 3B shows an example of two states and a shift in a threshold voltage for a single level memory cell.

FIG. 4 shows an example of a program and read process flow of a memory device including bit reliability information input adjustment to a decoder.

DETAILED DESCRIPTION

Figure 1A:
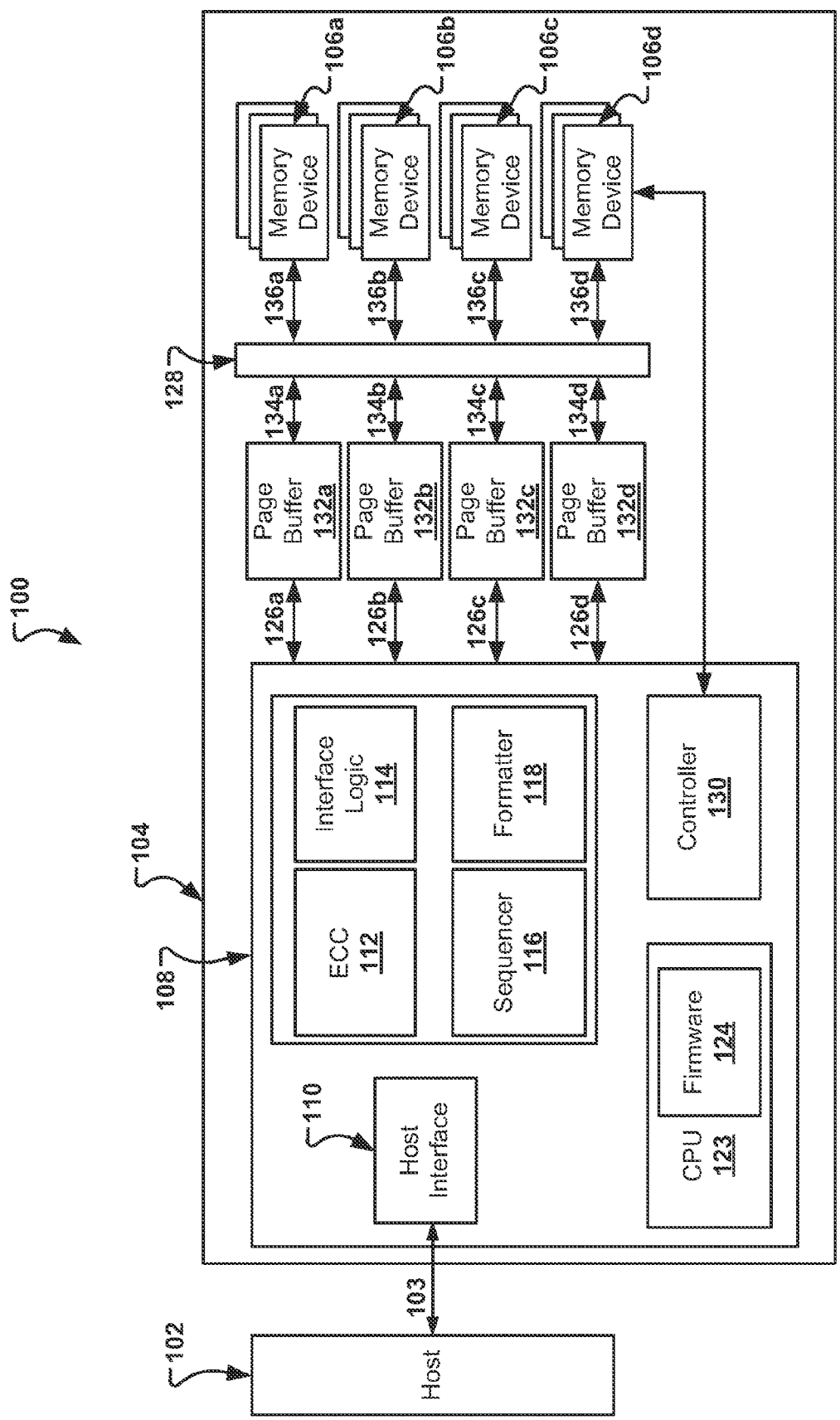
FIG. 1A shows an example of a solid state drive system.

The systems and techniques described herein can be implemented as one or more devices, such as one or more integrated circuit (IC) devices, in an electronic data storage device.

Memories are commonly structured as rectangular arrays of memory cells. The memory cells are arranged in orthogonal bit lines and word lines. One or more bits of data are written to each memory cell by injecting sufficient electrical charge into a floating gate of the memory cell to place the memory cell's threshold voltage within a range of threshold voltages that represents the value of that bit or of those bits. A memory cell is then subsequently read by comparing its threshold voltage to reference voltages that mark the boundaries between threshold voltage ranges. The read operation of the memory cell includes sensing the memory cell's threshold voltage. A reference voltage may be applied to the floating gate that turns on or off a floating gate transistor according to the threshold voltage level, which allows a peripheral circuit to sense the threshold voltage levels.

For a NOR flash memory, the memory cells are written and read individually. For a NAND flash memory, the memory cells are written and read one page at a time, with each word line including a small integral number (typically one or two, generally no more than four) of pages. The word lines are grouped further into blocks, such that memory cells are erased an entire block at a time.

However, data read from the cells are sometimes distorted. The threshold voltage can shift because of different factors, such as programming tolerance, noise, inter-cell interference (e.g., floating gate to floating gate coupling), etc., which can cause unrecoverable errors during read operations and may necessitate an error recovery step during reading.

For example, floating gate to floating gate coupling occurs when the apparent charge stored on the floating gate of a memory cell undergoes an apparent shift (e.g., threshold voltage drift) because of coupling from an electric field resulting from a charge stored on a subsequently programmed nearby memory cell's floating gate. While in theory the electric field from a charge on the floating gate of a memory cell may couple to the floating gate of any other memory cell in the array, the effect is most pronounced and noticeable with adjacent memory cells. Adjacent memory cells may include neighboring memory cells that are on the same bit line, neighboring memory cells on the same word line, or neighboring memory cells that are on both a neighboring bit line and neighboring word line, and across from each other in a diagonal direction. The apparent shift in charge may result in errors when reading the programmed memory state of a memory cell.

The effects of floating gate coupling occur in situations where a memory cell adjacent to a target memory cell is programmed subsequent to the target memory cell (e.g., in an odd/even word/bit line architecture). The charge placed on the floating gate of the adjacent memory cell, or a portion of the charge, may couple to the target memory cell resulting in an apparent shift of the threshold voltage of the target memory cell. This change in the apparent threshold voltage of the memory cell can result in a read error when subsequently reading the target memory cell. For example, a memory cell can have its apparent threshold voltage changed to such a degree after being programmed that the memory cell will not perform the expected function (e.g., turn on) under the applied reference voltage for the memory state to which it was programmed.

As another example, over time, charge may leak from the floating gates of the memory cells and interfere with the threshold voltage of the target cell. Threshold voltage drift can unexpectedly change the state of the target cell and the data value stored in the target cell that may lead to false reads of the target cell's true state.

FIG. 1 shows an example of a solid state drive system 100. As shown in FIG. 1, the system 100 can include a host 102 and a solid state drive system 104. The solid state drive system 104 may include a host interface 110, a central processor unit (CPU) 123, a memory interface 128, a controller 130 and memory devices 106*a*, 106*b*, 106*c* and 106*d* (e.g., flash memory devices, NOR Flash EEPROM (Electrically Erasable Programmable Read-Only Memory), AND Flash EEPROM, DiNOR Flash EEPROM, Serial Flash EEPROM, DRAM (Dynamic Random Access Memory), SRAM (Static Random Access Memory), EPROM (Erasable Programmable Read-Only Memory), FRAM (Ferroelectric Random Access Memory), MRAM (Magnetoresistive Random Access Memory), or PCRAM (Phase-Change Random Access Memory)).

The host 102 can communicate with the solid state drive system 104 through the host interface 110. The host interface 110, in some implementations, can include a Serial Advanced Technology Attachment (SATA) interface or a Parallel Advanced Technology Attachment (PATA) interface. A SATA interface or PATA interface can be used to convert serial or parallel data into parallel or serial data, respectively. For example, if the host interface 110 includes a SATA interface, then the SATA interface can receive serial data transferred from the host 102 through a bus 103 (e.g., a SATA bus), and convert the received serial data into parallel data. In other implementations, the host interface 110 can include a hybrid interface. In these implementations, the hybrid interface can be used in conjunction with, for example, a serial interface.

The host interface 110, in some implementations, can include one or more registers in which operating commands and addresses from the host 102 can be temporarily stored. For example, the host interface 110 can communicate a PROGRAM or READ command in response to stored information in the one or more registers.

As shown in FIG. 1A, the solid state controller 108 can include the host interface 110, an error correction code (ECC) module 112, interface logic 114, a sequencer 116, a formatter 118, the CPU 123 containing embedded firmware 124 by which the solid state controller 108 can be controlled, and the controller 130. The CPU 123 can include a microprocessor, a signal processor (e.g., a digital signal processor) or microcontroller. In some implementations, the CPU 123 with the embedded firmware 124 can reside outside of the solid state drive system 104.

In some implementations, the solid state drive system 104 can include one or more channels 126*a*, 126*b*, 126*c* and 126*d*, and each channel 126*a*-126*d* can be configured to receive one or more control signals (e.g., four chip-enable signals) or READ, PROGRAM or ERASE data or commands from the host 102 or from the memory devices 106*a*-106*d*.

The solid state controller 108 can be configured to handle any suitable command, status, or control request for access to the memory devices 106*a*-106*d*. For example, the solid state controller 108 can be configured to manage and control storage and retrieval of data in the memory devices 106*a*-106*d*. To initialize a READ, PROGRAM or ERASE operation, the solid state controller 108 can receive one or more service requests or commands (e.g., READ, PROGRAM and ERASE requests) from the host 102 (or from the controller 130).

In some implementations, the solid state controller 108 can be a part of a microcomputer system under the control of a microprocessor (not shown). The solid state controller 108 can control the flow of commands and data between the host 102 and the solid state drive system 104. In some implementations, the solid state controller 108 can include read-only memory (ROM), random-access memory (RAM) and other internal circuits. The solid state controller 108, in some implementations, can be configured to support various functions associated with the memory devices 106a-106d, such as, without limitation, diagnosing the memory devices 106a-106d, sending commands (e.g., activation, READ, PROGRAM, ERASE, pre-charge and refresh commands) to the memory devices 106a-106d, and receiving status from the memory devices 106a-106d. The solid state controller 108 can be formed on a same or different chip as the memory devices 106a-106d. The solid state controller 108 also can be formed on a same or different chip as the solid state drive system 104.

The memory devices 106a-106d can be coupled with the memory interface 128. In some implementations, if the memory devices 106a-106d include NAND-type memory devices, the memory interface 128 can be a NAND flash input/output interface. In some implementations, the memory devices 106a-106d can be formed as internal components of the solid state drive system 104 or the solid state controller 108. In other implementations, the memory devices 106a-106d can be formed as external components to the solid state drive system 104 or the solid state controller 108.

In some implementations, the solid state drive system 104 (and/or the host 102) can be mounted on a system on-chip (SOC). The SOC can include an embedded process system (e.g., an embedded CPU) separate from the CPU 123 in the solid state drive system 104. The SOC also can include a SRAM (Static Random Access Memory), system logic, cache memory and cache controller for processing program code and data. The program code and data associated with the embedded process system can be stored in the memory devices 106a-106d, and communicated to the SOC through, for example, an SOC interface (not shown). The SOC interface can be used by a translator for translating information flowing between the interface and the internal bus structure of the SOC. Control signals can flow from the SOC to the memory devices 106a-106d while instructions and data can flow from the memory devices 106a-106d to the SOC during READ operations. Instructions and data also can be sent to the memory devices 106a-106d during PROGRAM operations.

In some implementations, the memory devices 106a-106d can be controlled by the controller 130. The host 102 can communicate with the memory devices 106a-106d through the controller 130. The controller 130 can be connected to the memory devices 106a-106d through a corresponding pin or terminal. In these implementations, the controller 130 can be implemented as an application specific integrated circuit (ASIC) or as an SOC.

Additionally or alternatively, the host 102 can communicate with the memory devices 106a-106d through the solid state controller 108. For example, the host 102 can transmit one or more commands to the solid state controller 108, and through the memory interface 128, the solid state controller 108 can send the host's commands to the memory devices 106a-106d. The memory interface 128 can be a NAND flash I/O interface. The NAND flash interface can include one or more pins each corresponding to a specific function.

In some implementations, the memory devices 106a-106d can be coupled with a plurality of page buffers 132a, 132b, 132c and 132d. In some implementations, each memory device 106a-106d can be associated with a respective page buffer 132a-132d. For example, as illustrated in FIG. 1A, the memory device 106a can be associated with the page buffer 132a; the memory device 106b can be associated with the page buffer 132b; the memory device 106c can be associated with the page buffer 132c; and the memory device 106d can be associated with the page buffer 132d. If desired, each memory device 106a-106d also can be associated with more than one page buffer.

In some implementations, the page buffers 132a-132d may be used as a temporary storage during PROGRAM/READ operations on the memory cells of the selected page. Each page buffer 132a-132d can have a storage capability at least equal to a storage capability of a memory page (e.g., 2 Kb).

Each page buffer 132a-132d can store one page of write data to be programmed into one page of memory cells. Each page buffer 132a-132d can include, without limitation, registers, sense circuits for sensing data read from one page of memory cells, verify logic, latching circuits or writing drivers. During PROGRAM operations, each page buffer 132a-132d can latch PROGRAM data received over a respective channel 126a-126d, and transfer the latched data to the respective memory device 106a-106d. Each page buffer 132a-132d also can perform program verify operations to ensure that the programmed data has been properly programmed into the memory devices 106a-106d.

As discussed herein, the page buffers 132a-132d can be connected to the solid state controller 108 through respective channels 126a-126d. In some implementations, the page buffers 132a-132d also can be connected to the memory interface 128 through respective channels 134a, 134b, 134c and 134d, and to the memory devices 106a-106d through channels 136a, 136b, 136c and 136d. In some implementations, both the memory interface 128 and the page buffers 132a-132d can be formed as internal components of the solid state drive system 104 or the solid state controller 108. In other implementations, the page buffers 132a-132d can be formed as external components to the solid state drive system 104 or the solid state controller 108.

To select a particular page buffer 132a-132d for storing PROGRAM data, input (e.g., user input or input provided by software programs) can be received through a double data rate (DDR) interface (not shown), which can be error-corrected by the ECC module 112. For READ data, the ECC module 112 can be used to correct any error present in the READ data retrieved from the memory devices 106a-106d. For PROGRAM data, the ECC module 112 can be used to add one or more redundant bits to the PROGRAM data.

Once the PROGRAM data is written, the redundant bits allow error-correction to be performed in a subsequent READ cycle of the written PROGRAM data. The ECC module 112 can first select a set of data to be rewritten to the memory devices 106a-106d, add redundant data to the selected set of data, and pass the selected set of data with the redundant information to the memory devices 106a-106d through a corresponding channel 126a-126d (e.g., following a firmware request order issued by the firmware 124). Output of the ECC module 112 then can be used as a SELECT signal to designate a page buffer 132a-132d for a particular PROGRAM operation.

In some implementations, the memory devices 106a-106d can be multi-plane memory devices each including, for example, four planes. Each memory device 106a-106d also can include a non-volatile memory (e.g., a single-level flash memory or a multi-level flash memory). In some implementations, the nonvolatile memory can include a NAND-type flash memory module. A NAND-type flash memory module can include a command/address/data multiplexed interface such that commands, data, and addresses can be provided through corresponding input/output pins. Advantages of using NAND-type flash memory devices as the memory devices 106a-106d include, without limitation, faster boot and resume times; longer battery life; and higher data reliability.

Each memory device 106a-106d can be connected to a respective channel 126a-126d. Each channel 126a-126d can support, for example, one or more input and output lines, chip select signal lines, chip enable signal lines and the like. The channel also can support other signal lines such as, without limitation, write enable, read enable, read/busy output, and reset signal lines. To increase the degree of parallelism, each memory device 106a-106d can have its own channel connected to the solid state drive system 104 as shown in FIG. 1A. For example, memory device 106a can be connected to the solid state drive system 104 using channel 126a; memory device 106b can be connected to the solid state drive system 104 using channel 126b; memory device 106c can be connected to the solid state drive system 104 using channel 126c; and memory device 106d can be connected to the solid state drive system 104 using channel 126d. In other implementations, the memory devices 106a-106d can share a common channel.

The memory devices 106a-106d can be connected to the solid state drive system 104 via standard interfaces such as an Open NAND Flash Interface (OFNI). For the host-to-drive connection, standard connectors can be used that include, without limitation, SATA, USB (Universal Serial Bus), SCSI (Small Computer System Interface), PCMCIA (Personal Computer Memory Card International Association), and IEEE-1394 (Firewire).

Each memory device 106a-106d can include one or more dies (e.g., flash dies), each being selected using a chip enable signal or chip select signal. A solid state storage die can be partitioned into planes, blocks and pages. In some implementations, a page can have a capacity of 2Kbytes, 4Kbytes, 8K bytes or 16KB. In some implementations, each die can be configured as a single bit memory cell (SLC) memory or multi-level memory cell (MLC) memory, with corresponding commands.

Where multiple dies are used, in some implementations, the solid state drive system 104 can access more than one die in a same memory device at the same time. The solid state drive system 104 also can access different dies in different memory devices at the same time. The capability to access more than one die allows the solid state drive system 104 to fully utilize the available resources and channels 126a-126d to increase the overall performance of the solid state drive system 104. Further, where the memory devices 106a-106d share a same memory input/output line and control signal (e.g., chip enable signal), the number of pins of the solid state controller 108 can be reduced to further minimize the cost for manufacturing the solid state drive system 104.

A memory array of a memory device 106a-106d can typically be organized into bits, bytes, or pages. For example, a page can include a user portion containing 2 k bytes (or 2 kB), and a spare portion containing 64 bytes. The memory array further can be organized into blocks. For example, each block can contain 128 pages.

Each of the memory devices 106a-106d can be a multi-plane NAND flash memory device. NAND flash memory devices generally have higher density and lower cost per bit than NOR-type flash memory devices. A NAND flash memory can be coupled with a NAND flash I/O interface that allows sequential access to data. A NAND flash I/O interface can include multiple pins each corresponding to a specific function.

A bit, either a zero-bit or a one-bit, can generally be stored in a memory cell of the memory device 106a-106d. A memory cell is a memory element containing values of one or more data bits. A single-level memory cell (SLC) stores only one bit of data whereas a multi-level memory cell (MLC) can store more than one bit by choosing between multiple levels of electrical charge to apply to the floating gate of the memory cell. For example, while a SLC can be programmed with a logical value of "1" or "0", a MLC can be programmed with a logical value of "11", "10", "01", or "00".

Figure 1B:
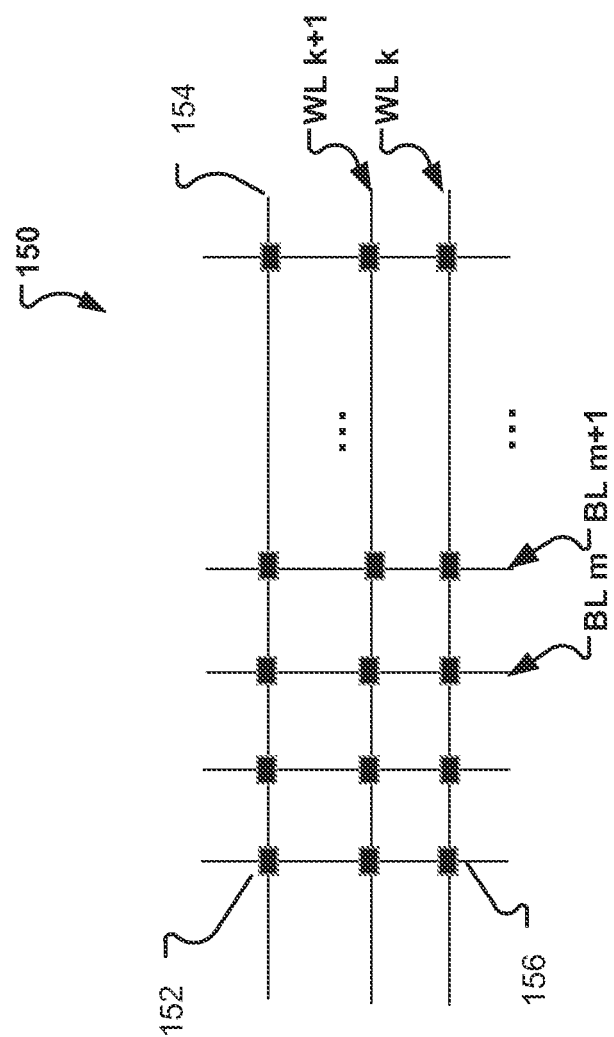
FIG. 1B shows an example of a flash memory array.

Referring to FIG. 1B, memory cells 152 of memory array 150 are arranged in a grid having multiple rows and columns. Though not illustrated, each memory cell 152 can include a floating gate transistor. A certain amount of electrical charge (electrons or holes) can be stored in a particular memory cell by applying appropriate voltage levels to the transistor gate, source and drain. The value stored in the memory cell can be read by measuring the threshold voltage of the memory cell. The threshold voltage is the minimal voltage that needs to be applied to the gate of the transistor in order to drive the transistor to a conduction state. The read threshold voltage can then be used to indicate the charge stored in the memory cell.

The gates of the transistors in each row can be connected by a respective word line 154 (e.g., WL k, WL k+1, . . . , where k≥0 and is an integer), and the sources of the transistors in each column can be connected by a bit line 156 (e.g., BL m, BL m+1, . . . , where m≥0 and is an integer). Where NOR memory cells are used, the sources can be connected to the bit lines 156 directly, and where NAND memory cells are used, the bit lines 156 can be connected to strings of floating-gate memory cells.

As discussed previously, a memory cell array can be divided into multiple pages (e.g., groups of memory cells that are programmed and read simultaneously). Pages are sometimes sub-divided into sectors. In some implementations, each page can include an entire row (word line) of the array. In other implementations, each row can be divided into two or more pages. For example, each row can be divided into two pages with one including the odd-order memory cells and the other including the even-order memory cells. In some implementations, a two-bit-per-memory cell memory can include four pages per row; a three-bit-per-cell memory can include six pages per row; and a four-bit-per-memory cell memory can include eight pages per row.

Erasing of memory cells can be carried out in blocks that contain multiple pages. A memory can include several hundreds or thousands erasure blocks. In a typical two-bit-per-memory cell memory, each erasure block can be on the order of thirty-two word lines, each including several hundreds or thousands of memory cells. Each word line can be partitioned into four pages (e.g., odd/even order memory cells, and least/most significant bit of the memory cells). Similarly, a three-bit-per-memory cell memory can include thirty-two word lines per erasure block and one hundred ninety two pages per erasure block, while a four-bit-per-memory cell memory can include two hundred fifty six pages per erasure block.

A non-volatile memory device such as flash memory devices can organize data in a bit-page-block hierarchy. For example, for a NAND memory device, the read/program unit can be a page and the erase unit can be a block. In a SLC that can store one bit of information, a page of data resides in the cells from the same word line. In a MLC that can store more than one bit of information, the data stored in the cells from the same word line can be subdivided into two or more pages.

Figure 2:
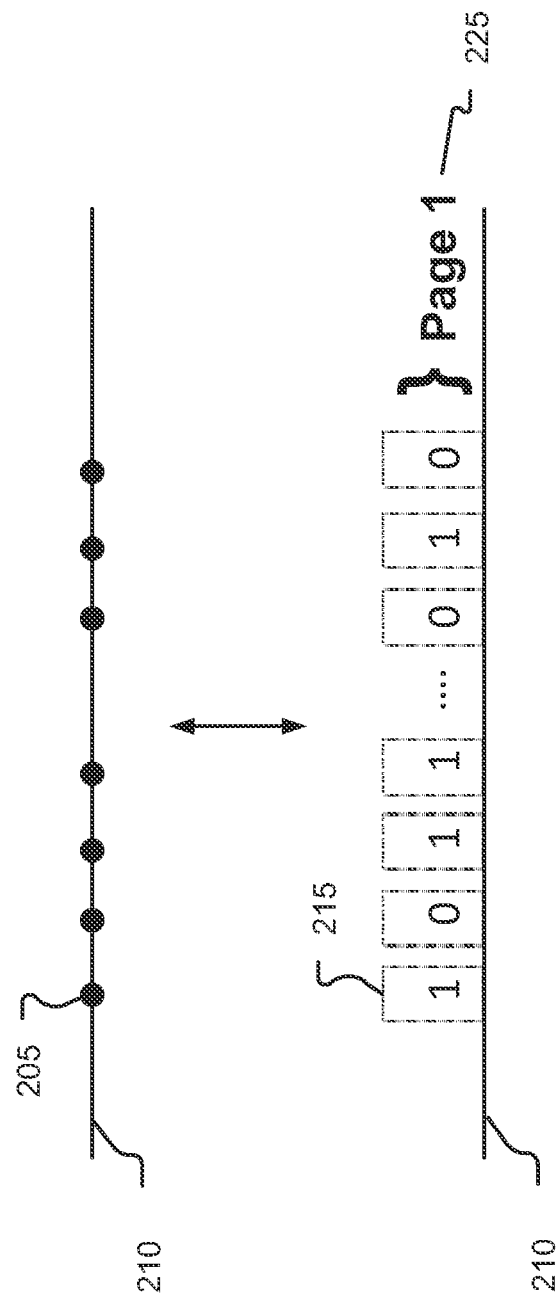
FIG. 2 shows an example of a page layout for a single level cell structure.

FIG. 2 shows an example of a page layout for a single-level cell structure. In this example, single-level cells 205 that are associated with the same word line 210 are grouped into a page 225. Single-level cells 205 store information that represents states 215, respectively. A state 215 can be associated with a bit of data. For example, a state 215 can correspond to a 0 or 1 bit value.

A non-volatile memory controller can process charge measurement data from a SLC based on voltage distributions to determine a state stored by the SLC. A non-volatile memory controller can generate read data based on a determined state. In some implementations, read data include a page, such as page 225.

FIG. 3A shows an example of two states and associated voltage distributions for a SLC. Two states and associated voltage distributions 310 and 320 are arranged on a graph 300 depicted by FIG. 3A. The voltage distributions 310 and 320 can be referred to as level distributions. The two level distributions 310 and 320 have mean values of $m_0$ and $m_1$ and can have standard distributions (i.e., Gauss distributions) of $\sigma_0$ and $\sigma_1$ respectively. The SLC can store information corresponding to one of two states (e.g., S0 and S1). The two states depicted by FIG. 3A represent a bit value of 1 (S0) and 0 (S1) respectively. The two states are associated with the two level distributions 310 and 320.

The two level distributions 310 and 320 shown in FIG. 3A are associated with two different levels of charge that may be stored in the SLC, each level distribution having its own mean and variance. A reference voltage 330 (i.e., a detection threshold) can be selected to minimize the read error rate. For example, an optimal reference voltage can be the minimum raw bit error rate (BER) before decoding.

Writing and reading data to and from the SLC can be based on the reference voltage 330 and the mean values of the level distributions 310 and 320 of the 1-bit memory cell. In some implementations, the reference voltage 330 is used to read data from the memory cells. In some implementations, the mean values (e.g., $m_0$ and $m_1$) of the level distributions 310 and 320 are used to write data to the memory cell.

The reference voltage 330 can be used during a read operation to determine whether the charge stored in the memory cell is at level 0 or level 1. For example, based on the reference voltage 330, a memory controller can determine whether a charge stored (including potentially a stored zero charge) in the memory cell is less than the reference voltage 330 in order to determine whether the stored charge is at level 0. Similarly, to determine whether the charge stored in the memory cell is at level 1, a memory controller can determine whether the charge stored in the memory cell is greater than the reference voltage 330.

Referring to FIG. 3A, state 0 of the single-level cell corresponds to a nominal threshold voltage v0 and state 1 corresponds to a nominal threshold voltage v1. The reference voltage 330 to determine the state of the memory cell is selected to minimize the read error rate. However, due to disturbances, programming tolerances, noise, etc., the nominal threshold voltage (v0 and/or v1) can shift, which may cause a detection error.

FIG. 3B shows an example of a shift in the nominal threshold voltage v1 in a graph 350. In this example, the nominal threshold voltage v1 has shifted to a nominal threshold voltage v1* with a level distribution 320* having a mean value of $m_{1*}$ and a standard distribution of $\sigma_{1*}$. Since the reference voltage 330 does not shift relative to the nominal threshold voltage v1 during the same read cycle, the reference voltage 330 is closer to v0 than to v1*. This reference voltage offset can result in an increased read error rate.

In some implementations, a 0/1 bit count difference of the data can be monitored making the memory controller aware of a potential shift of a threshold voltage and a shift of the optimal reference voltage respectively. In order reduce the error probability, the reference voltage 330 can be adjusted to reference voltage 330*. However, adjusting the reference voltage is performed off-line and the error rate cannot be improved in the current read cycle of the memory device. Thus, re-reading the memory device may be necessary to achieve a minimum read error rate, which can be time-consuming and cause a long latency for data recovery, and therefore impact the read performance of the memory device.

To improve the error detection performance and therefore to reduce the re-read probability of the memory device, a real-time adjustment of the bit reliability information that is input to a decoder can be implemented. The adjustment of the bit reliability information input can be based on monitoring 0 and 1 bit counts of data received from a memory device.

FIG. 4 shows an example of a program and read process flow 400 of a memory device including bit reliability information input adjustment to a decoder. A solid state controller, such as solid state controller 108 as shown in FIG. 1A, can be configured to program data to one or more memory devices, such as memory devices 106a-d as shown in FIG. 1A, and to read data from the one or more memory devices. For the programming operation, the solid state controller can use a scrambler 410, an encoder 420 (e.g., a low-density-parity-check (LDPC) encoder), and a memory controller (e.g., a flash controller), such as controller 130 as shown in FIG. 1A. For the read operation, the solid state controller can use the memory controller, a decoder 460 (e.g., a LDPC decoder), and a de-scrambler 470. In some implementations, the solid state controller can access the memory device(s) through a memory interface, such as memory interface 128 as shown in FIG. 1A.

The solid state controller 108 can receive binary data (i.e., data comprising 0 and 1 bit values), for example through a host interface from a host, to be stored in the memory device(s). The scrambler 410 can be configured to balance the 0 and 1 bit counts of the received data to reduce the 0/1 bit count delta. The scrambled data can be encoded by the encoder 420 (e.g., a LDPC encoder).

In some implementations, the memory controller can be configured to program a 0/1 bit count delta (i.e., a count of "0" bit values compared to a count of "1" bit values) of the data, and along with the data, into the memory device(s). In some implementations, the 0/1 bit count delta can be associated with the data (e.g., as meta-data) and programmed into the memory device(s). In some implementations, the 0/1 bit count delta can be attached to the data and programmed into the memory device(s). In some implementations, the 0/1 bit count delta can be associated with, or attached to, the data by a formatter, such as formatter 118.

The memory controller can be configured to read the stored data from the memory device. During the read operation, the reference voltage is selected to sense the threshold voltage. Error correction code (ECC) can be used to correct errors in the read data. However, as described herein with respect to FIGS. 3A and 3B, the threshold voltage may shift and the selected reference voltage to sense the threshold voltage may not be the optimal reference voltage anymore (i.e., the reference voltage has shifted with respect to the shift in the threshold voltage). Thus, when such a threshold voltage shift occurs, sensing the threshold voltage with the selected reference voltage can result in an increased read error rate and even with sophisticated ECC, such as low-density-parity-check (LDPC), the data may not be recoverable.

To improve the error correction performance, a bit reliability information input to the decoder 460 can be adjusted substantially in real time. In some implementations, upon reading the data from the memory device(s), the controller 130 can check the read data for a 0 and 1 bit value count and determine a 0/1 bit count delta of the read data. The controller 130 can adjust the bit reliability information input to the decoder 460.

In some implementations, the controller 130 can be configured to extract the 0/1 bit count delta that was programmed into the memory device(s) along with the data. The extracted 0/1 bit count delta and the determined 0/1 bit count delta can be compared by the controller 130. A potential shift of the optimal reference voltage can be determined based on the comparison of the 0/1 bit count deltas (e.g., a large difference of the 0/1 bit count deltas indicates a shift in the optimal reference voltage). The bit reliability information input to the decoder 460 can be adjusted based on the comparison of the 0/1 bit count deltas to improve the decoding performance of the data read from the memory device(s). For example, if the applied reference voltage is close to the threshold voltage level of bit 1, the difference of the 0/1 bit count deltas increases, and thus, bit 1 should be more reliable. If the applied reference voltage is close to the threshold voltage level of bit 0, the difference of the 0/1 bit count deltas decreases, and thus, bit 0 should be more reliable.

The decoder 460 can decode the data read from the memory device(s) based, at least in part, on the adjusted bit reliability information input. The de-scrambler 470 can descramble the decoded data and the solid state controller can provide the descrambled data to a host through the host interface, for example.

Generally, when the described process is implemented for a multi-level cell (MLC), potential shifts of multiple optimal reference voltages to determine the respective states of the MLC can be determined based on comparing bit count deltas and bit reliability input information input for the respective reference voltages can be adjusted accordingly.

Figure 5A:
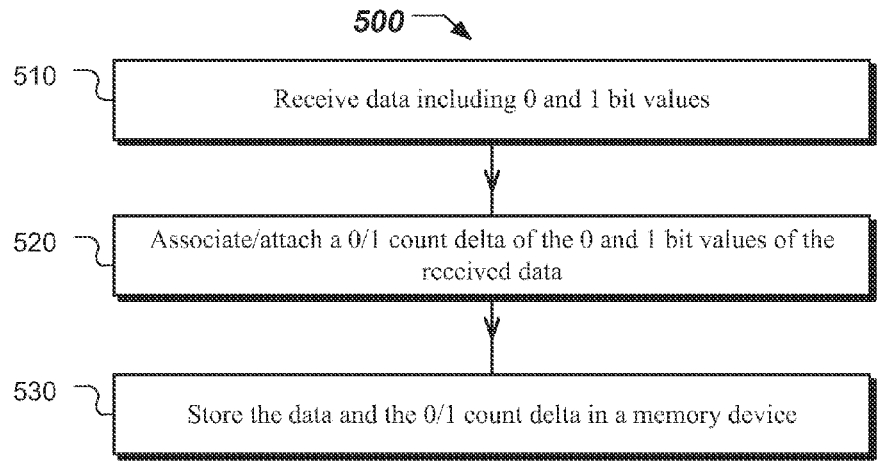
FIG. 5A shows an example of a programming process of a memory device.

FIG. 5A shows an example of a programming process 500 of a memory device. At 510, data including 0 and 1 bit values can be received. At 520 a 0 and 1 bit count delta of the received data can be associated (e.g., as meta-data) or attached to the received data. In some implementations, the 0/1 bit count delta can be determined by comparing a number of "0" bit values with a number of "1" bit values of the received data. At 530, the received data and the 0/1 bit count delta can be stored in a memory device (e.g., a flash memory device).

Figure 5B:
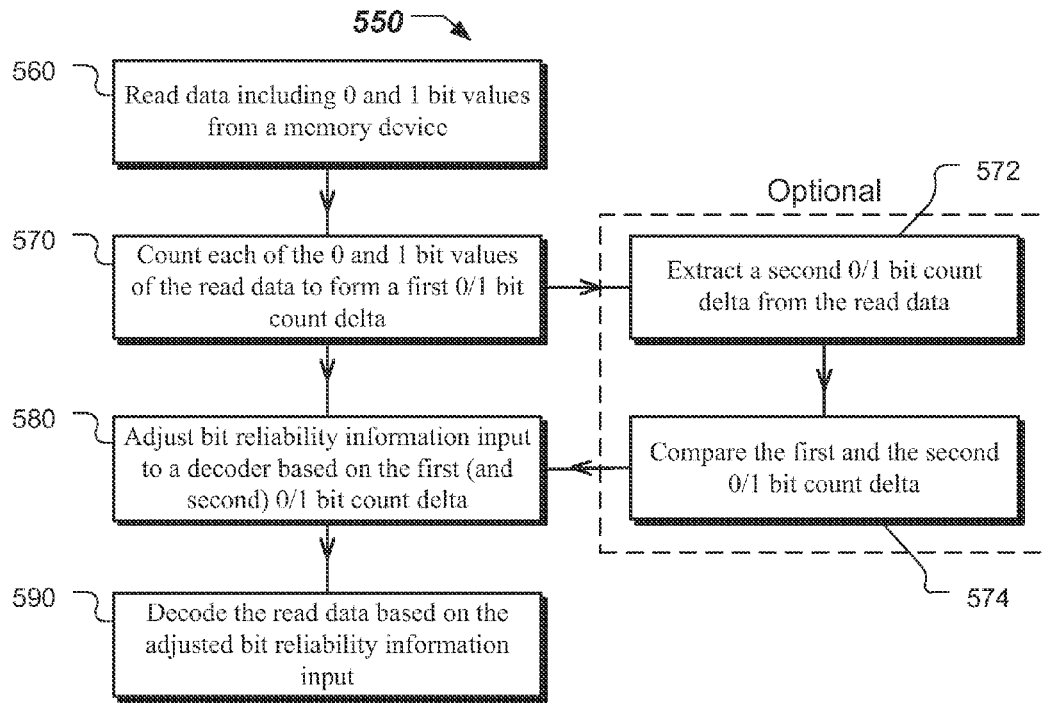
FIG. 5B shows an example of a read process of a memory device.

FIG. 5B shows an example of a read process 550 of a memory device. At 560, data including 0 and 1 bit values can be read from a memory device. At 570, each of the 0 and 1 bit values of the read data can be counted to form a first 0/1 bit count delta. At 580, a bit reliability information input to a decoder can be adjusted based, at least in part, on the first 0/1 bit count delta. At 590, the decoder can decode the read data based, at least in part, on the adjusted bit reliability information input to improve the error correction performance.

In some implementations, a second 0/1 bit count delta can be associated with or attached to data and stored along the data in a memory device, for example, as described herein with respect to FIG. 5A. At 572, the second 0/1 bit count delta can be extracted from the read data. As described above, the second 0/1 bit count delta can be determined during the programming operation of the data into the memory device. At 574, the first and second 0/1 bit count delta can be compared. A large difference between the first and the second 0/1 bit count delta can indicate that a threshold voltage, and consequently the optimal reference voltage to sense the threshold voltage, has shifted. A value defining a large difference between the first and the second 0/1 bit count delta can depend on various factors, such as noise model, device voltage curve, etc.

At 580, the bit reliability information input to the decoder can be adjusted based on the comparison of the first and second 0/1 bit count delta and at 590, the decoder can decode the read data based on the adjusted bit reliability information input.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

The implementations described above can also be implemented for other types of non-volatile or persistent memory, which may not be solid state. Other implementations fall within the scope of the following claims.

What is claimed is:

1. A memory controller comprising:
   circuitry configured to receive data from a memory device, the data comprising at least first and second states;
   circuitry configured to compare a number of the first and second states of the received data; and
   circuitry configured to adjust a bit reliability information input to a decoder based, at least in part, on the comparison;
   wherein the comparison provides a first delta, the memory controller further comprises circuitry configured to extract a second delta of first and second states, the second delta having been programmed into the memory device along with the data, and the circuitry configured to adjust comprises circuitry configured to compare the first delta and the second delta to adjust the reliability information input.

2. The memory controller of claim 1, further comprising circuitry configured to associate the second delta with the data as meta-data during programming of the memory device with the data.

3. The memory controller of claim 1, further comprising:
   circuitry configured to attach the second delta to the data during programming of the memory device with the data.

4. The memory controller of claim 1, further comprising the decoder configured to decode the data based, at least in part, on the adjusted bit reliability information input.

5. The memory controller of claim 4, wherein the decoder comprises a low-density-parity-check (LDPC) decoder.

6. A method comprising:
   receiving data from a memory device, the data comprising at least first and second states;
   comparing a number of the first and second states of the received data, wherein the comparison provides a first delta;
   extracting a second delta of first and second states, the second delta having been programmed into the memory device along with the data;
   comparing the first delta and the second delta; and
   adjusting a bit reliability information input to a decoder based, at least in part, on the comparison of the first delta and the second delta.

7. The method of claim 6, further comprising associating the second delta with the data as meta-data during programming of the memory device with the data.

8. The method of claim 6, further comprising:
   attaching the second delta to the data during programming of the memory device with the data.

9. The method of claim 6, further comprising decoding the data based, at least in part, on the adjusted bit reliability information input.

10. The method of claim 9, wherein the decoder comprises a low-density-parity-check (LDPC) decoder.

11. A computer-program product, encoded on a non-transitory computer-readable medium, operable to cause data processing apparatus to perform operations comprising:
    receiving data from a memory device, the data comprising at least first and second states;
    comparing a number of the first and second states of the received data, wherein the comparison provides a first delta;
    extracting a second delta of first and second states, the second delta having been programmed into the memory device along with the data;
    comparing the first delta and the second delta; and
    adjusting a bit reliability information input to a decoder based, at least in part, on the comparison of the first delta and the second delta.

12. The computer-program product of claim 11, wherein the operations further comprise associating the second delta with the data as meta-data during programming of the memory device with the data.

13. The computer-program product of claim 11, wherein the operations further comprise:
    attaching the second delta to the data during programming of the memory device with the data.

14. The computer-program product of claim 11, wherein the operations further comprise decoding the data based, at least in part, on the adjusted bit reliability information input.

15. The computer-program product of claim 14, wherein the decoder comprises a low-density-parity-check (LDPC) decoder.

* * * * *